United States Patent
Cha

(10) Patent No.: US 7,537,971 B2
(45) Date of Patent: May 26, 2009

(54) METHOD FOR FABRICATING CMOS IMAGE SENSOR

(75) Inventor: Han-Seob Cha, Chungcheongbuk-do (KR)

(73) Assignee: MagnaChip Semiconductor Ltd., Chungcheongbuk-do (KR)

( * ) Notice: Subject to any disclaimer, the term of this patent is extended or adjusted under 35 U.S.C. 154(b) by 325 days.

(21) Appl. No.: 11/474,409

(22) Filed: Jun. 26, 2006

(65) Prior Publication Data

US 2007/0004120 A1   Jan. 4, 2007

(30) Foreign Application Priority Data

Jun. 30, 2005  (KR) .................. 10-2005-0058458

(51) Int. Cl.
  *H01L 21/20* (2006.01)
(52) U.S. Cl. ............... 438/134; 438/181; 257/E21.241; 257/E21.244; 257/E21.275; 257/E21.279; 257/E21.576; 257/E27.131; 257/E27.133; 257/E31.032; 257/E31.054
(58) Field of Classification Search ................ 438/199, 438/134, 181; 257/E21.241, 244, 275, 279, 257/576, 577, 653, E27.131, 133
See application file for complete search history.

(56) References Cited

U.S. PATENT DOCUMENTS

| | | | |
|---|---|---|---|
| 6,329,233 B1 * | 12/2001 | Pan et al. ..................... 438/199 |
| 6,348,706 B1 * | 2/2002 | Sandhu ........................ 257/296 |
| 6,495,391 B1 * | 12/2002 | Chan ............................ 438/59 |
| 6,627,475 B1 * | 9/2003 | Yang et al. .................... 438/57 |
| 6,713,127 B2 * | 3/2004 | Subramony et al. .... 427/255.37 |
| 6,835,590 B2 * | 12/2004 | Lee .............................. 438/69 |
| 7,122,408 B2 * | 10/2006 | Mouli et al. ................. 438/134 |
| 2002/0027239 A1 * | 3/2002 | Ohkubo ....................... 257/292 |
| 2005/0062078 A1 * | 3/2005 | Han ............................. 257/233 |
| 2009/0008684 A1 * | 1/2009 | Kuroda ........................ 257/292 |

* cited by examiner

*Primary Examiner*—Michael S Lebentritt
(74) *Attorney, Agent, or Firm*—Morgan Lewis & Bockius LLP

(57) ABSTRACT

A method for fabricating a complementary metal-oxide semiconductor (CMOS) image sensor includes performing an ion implantation process onto a photodiode region in a first conductivity type semiconductor layer to form a second conductivity type first impurity region, and performing an annealing process in a gas atmosphere including first conductivity type impurity atoms to form a first conductivity type second impurity region underneath a surface of the first conductivity type semiconductor layer in the second conductivity type first impurity region, wherein the first conductivity type second impurity region is doped with the diffused first conductivity impurity atoms.

15 Claims, 3 Drawing Sheets

METHOD FOR FABRICATING CMOS IMAGE SENSOR

FIELD OF THE INVENTION

The present invention relates to an image sensor, and more particularly, to a method for fabricating a complementary metal-oxide semiconductor (CMOS) image sensor.

DESCRIPTION OF RELATED ARTS

Generally, an image sensor is a device that captures image information using a photo-reaction in a semiconductor material. The device transforms electrical values in pixels into a level capable of signalizing, each pixel detecting subjects with different brightness and wavelength. The image sensor generally includes a charge coupled device (CCD) image sensor and a complementary metal-oxide semiconductor (CMOS) image sensor. The image sensor uses a photodiode as a photodetector, which absorbs light captured from an external subject image, and collects and accumulates photo-charges.

A typical unit pixel of a CMOS image sensor includes a photodiode and four transistors. The four transistors are a transfer transistor, which transfers photocharges integrated in the photodiode to a floating diffusion region; a reset transistor, which sets an electric potential level of a node to a desired value and discharges electric charges to reset the floating diffusion region; a select transistor, which allows addressing by switching; and a drive transistor, which functions as a source follower buffer amplifier. The transfer transistor and the reset transistor utilize native transistors, and the drive transistor and the select transistor utilize normal transistors. The reset transistor is a transistor for correlated double sampling (CDS).

Such unit pixel of a CMOS image sensor uses the native transistor to detect light in a visible light wavelength band, and sends the detected photocharges to the floating diffusion region, i.e., a gate of the drive transistor, and then, outputs the photocharges sent to the floating diffusion region as electrical signals at an output terminal.

FIG. 1 is a cross-sectional view illustrating a typical CMOS image sensor. Herein, only a photodiode and a transfer transistor are illustrated. A P-type epitaxial layer 12 is formed on a $P^{++}$-type substrate 11. The P-type epitaxial layer 12 is doped with P-type impurities in-situ and is formed by an epitaxial growth process, and the $P^{++}$-type substrate 11 is highly doped with P-type impurities. A field oxide layer 13 is formed in a predetermined portion of the P-type epitaxial layer 12 for use in device isolation.

A gate oxide layer 14 is formed on a predetermined portion of the P-type epitaxial layer 12, and a gate electrode 15 of the transfer transistor is formed on the gate oxide layer 14. Spacers 16 are formed on both sidewalls of the gate oxide layer 14 and the gate electrode 15.

An N-type impurity region 17 having a predetermined depth is formed in the P-type epitaxial layer 12. The N-type impurity region 17 is formed to align with an edge of the corresponding spacer 16 formed on one sidewall of the gate electrode 15. A P-type impurity region 18 is formed to align with the corresponding spacer 16, and is formed between a top surface of the N-type impurity region 17 and a top surface of the P-type epitaxial layer 12. The N-type impurity region 17 is referred to as a deep $N^-$ region and the P-type impurity region 18 is referred to as a $P^0$ region.

According to the typical technology described with FIG. 1, electron hole pair (EHP) carriers are generated by lights near a PN junction region, which includes the N-type impurity region 17 and the P-type epitaxial layer 12, and the carriers moving to the transfer transistor by a bias generate an electric current. Thus, light energy is transformed into electric current. Consequently, the PN junction region including the N-type impurity region 17 and the P-type epitaxial layer 12 becomes the photodiode.

The P-type impurity region 18 formed on the N-type impurity region 17, that is, on top of the photodiode, isolates the photodiode and the surface of the silicon substrate, i.e., the P-type epitaxial layer 12. Thus, an inflow of dark current through the surface of the silicon substrate caused by a silicon dangling bond can be prevented.

However, there are a few limitations while conventionally forming the P-type impurity region 18. Because the P-type impurity region 18 is formed by employing an ion implantation process, a crystallization defect usually occurs. The crystallization defect occurs due to a characteristic of the ion implantation process, that is, ion collision, and the crystallization defect may result in a dark current.

It is difficult to keep a depth of boron implantation shallow due to a characteristic of the ion implantation. After the ion implantation process, a thermal process is performed for an electrical activation. The implanted boron diffuses up to 1,000 Å from a top surface of the substrate structure during the thermal process. Thus, a thickness of 1,000 Å from the top surface becomes excluded from the photodiode. Blue light having a wavelength near 400 nm is capable of penetrating a thickness of 400 Å in silicon. Thus, if the thickness of the P-type impurity region 18 becomes approximately 1,000 Å, then light efficiency of the light in a wavelength bandwidth of 400 nm to 500 nm deteriorates. That is, blue light having a wavelength bandwidth of 400 nm cannot penetrate more than 400 Å of a silicon layer. Thus, carrier generation efficiency of the blue light decreases as the thickness of the P-type impurity region 18 becomes larger.

In order to overcome the above mentioned limitations, the thickness of the P-type impurity region 18 is generally required to be decreased. Consequently, the P-type impurity region 18 may not be sufficiently doped, and thus, the P-type impurity region 18 may not function properly, and often results in deteriorated light characteristics.

A method for forming a P-type impurity region by depositing a boron silicate glass (BSG) and diffusing boron doped in the BSG has been introduced to reduce the occurrences of the crystallization defect during the formation of the P-type impurity region by employing the ion implantation process.

However, it is difficult to form a highly doped P-type impurity region having a small thickness by employing the BSG deposition method.

SUMMARY OF THE INVENTION

It is, therefore, an object of the present invention to provide a complementary metal-oxide semiconductor (CMOS) image sensor, which can improve light efficiency of blue light by forming a P-type impurity region, which is formed to isolate a photodiode and a top surface of a substrate structure, with a small thickness, reduce a crystallization defect, which may occur during an ion implantation process, and improve light characteristics by forming a highly doped P-type impurity region.

In accordance with an aspect of the present invention, there is provided a method for fabricating a CMOS image sensor, including: performing an ion implantation process onto a photodiode region in a first conductivity type semiconductor layer to form a second conductivity type first impurity region;

and performing an annealing process in a gas atmosphere including first conductivity type impurity atoms to form a first conductivity type second impurity region underneath a surface of the first conductivity type semiconductor layer in the second conductivity type first impurity region, wherein the first conductivity type second impurity region is doped with the diffused first conductivity impurity atoms.

BRIEF DESCRIPTION OF THE DRAWINGS

The above and other objects and features of the present invention will become better understood with respect to the following description of the exemplary embodiments given in conjunction with the accompanying drawings, in which.

DETAILED DESCRIPTION OF THE INVENTION

A method for fabricating a complementary metal-oxide semiconductor (CMOS) image sensor in accordance with exemplary embodiments of the present invention will be described in detail with reference to the accompanying drawings.

FIGS. 2A to 2E are cross-sectional views illustrating a method for fabricating a CMOS image sensor in accordance with a specific embodiment of the present invention.

Figure 1:
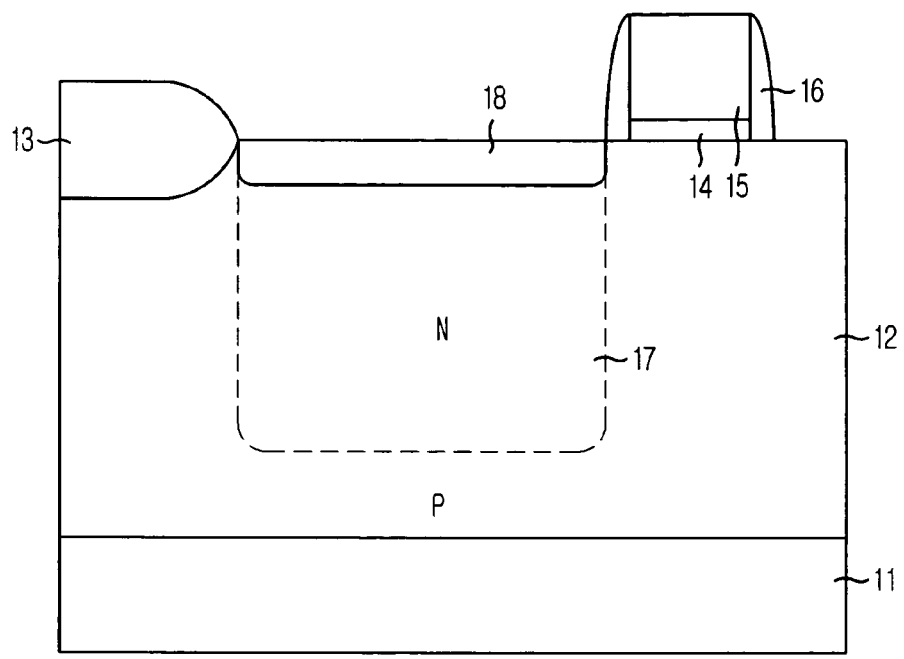
FIG. 1 is a cross-sectional view illustrating a typical complementary metal-oxide semiconductor (CMOS) image sensor.
Figure 2A:
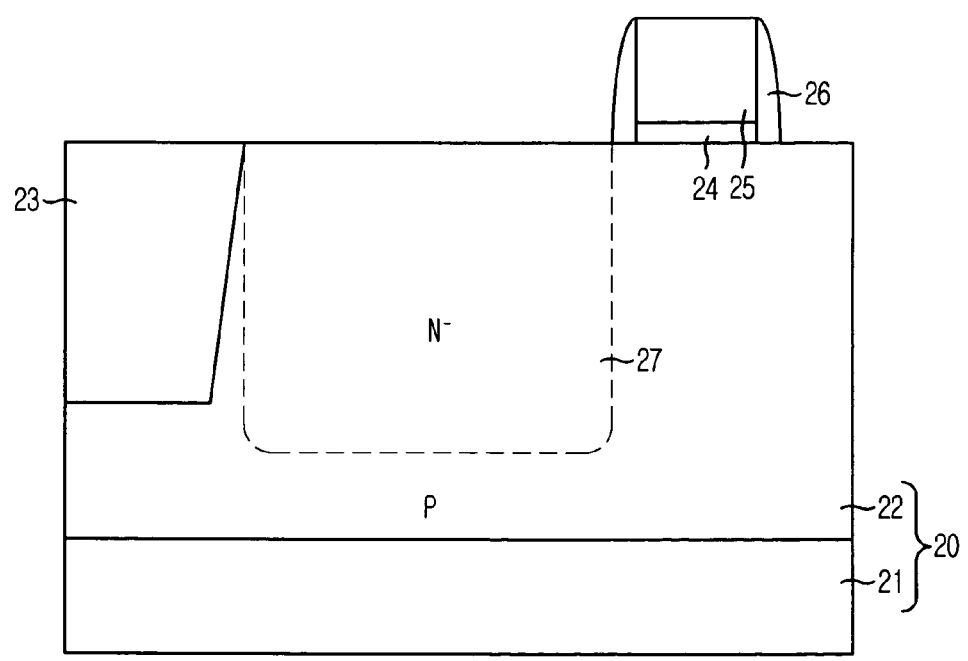
FIGS. 2A to 2E are cross-sectional views illustrating a method for fabricating a photodiode in a CMOS image sensor in accordance with a specific embodiment of the present invention.

As shown in FIG. 2A, a P-type epitaxial layer 22 lowly doped with P-type impurities is grown over a $P^{++}$ substrate 21 highly doped with P-type impurities. A field oxide layer 23 is formed in a predetermined portion of the P-type epitaxial layer 22. Depth of a depletion layer of a photodiode can increase because of the lowly doped P-type epitaxial layer 22, and thus, photosensitivity can be improved. A crosstalk between unit pixels can be reduced by reaggregating the photocharges through the existence of the highly doped $P^{++}$ substrate 21. The crosstalk occurs due to irregular movements of photocharges in a deeper portion of the $P^{++}$ substrate 21 where the depletion layer of the photodiode does not reach. Since the $P^{++}$ substrate 21 and the P-type epitaxial layer 22 are doped with P-type impurities, a combined layer of the $P^{++}$ substrate 21 and the P-type epitaxial layer 22 is referred to as a P-type semiconductor layer 20 for convenience.

A gate oxide layer 24 is formed over the P-type epitaxial layer 22, and then, a gate electrode 25 for four transistors of the unit pixel is formed over the gate oxide layer 24. Particularly, the gate electrode 25 is referred to as a gate electrode of a transfer transistor.

Spacers 26 are formed on both sidewalls of the gate oxide layer 24 and the gate electrode 25. The spacers 26 are formed by depositing a nitride layer and performing an etch-back process thereon. A structure including the gate oxide layer 24, the gate electrode 25, and the spacers 26 is referred to as a gate pattern.

After forming the gate electrode 25, processes for forming a photodiode region are performed. An N-type impurity region 27 is formed in the P-type epitaxial layer 22 to align with an edge of the corresponding spacer 26 in one side of the gate pattern, that is, between the field oxide layer 23 and the gate pattern. The N-type impurity region 27 is formed by implanting N-type impurity ions. One of phosphorus (P) and arsenic (As) ions are implanted. By forming the N-type impurity region 27, a PN junction region including the P-type epitaxial layer 22 and the N-type impurity region 27 is formed. The PN junction region constitutes a photodiode.

Figure 2B:
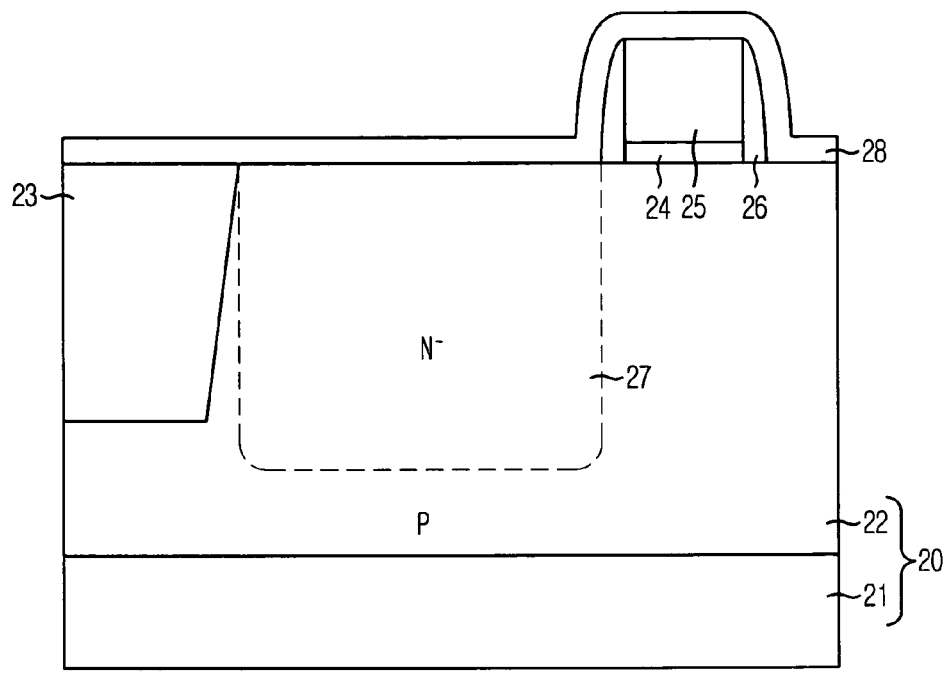

As shown in FIG. 2B, a barrier layer 28 is formed over the field oxide layer 23, the gate pattern, and the N-type impurity region 27. The barrier layer 28 includes an oxide layer formed in a thickness ranging from approximately 200 Å to approximately 300 Å by employing a low pressure chemical vapor deposition (LPCVD) method. For instance, the barrier layer 28 may be a tetraethyl orthosilicate (TEOS) layer. Such LPCVD method can be referred to as a low pressure furnace chemical vapor deposition method.

Meanwhile, a single-wafer type chemical vapor deposition method can be used instead of the low pressure furnace chemical vapor deposition method when forming the barrier layer 28. If the barrier layer 28 is formed by employing the single-wafer type chemical vapor deposition method, a thermal budget which may occur during the low pressure furnace chemical vapor deposition method can be reduced. The barrier layer 28 is formed to prevent boron from diffusing into regions other than the photodiode region during a subsequent annealing process.

Figure 2C:
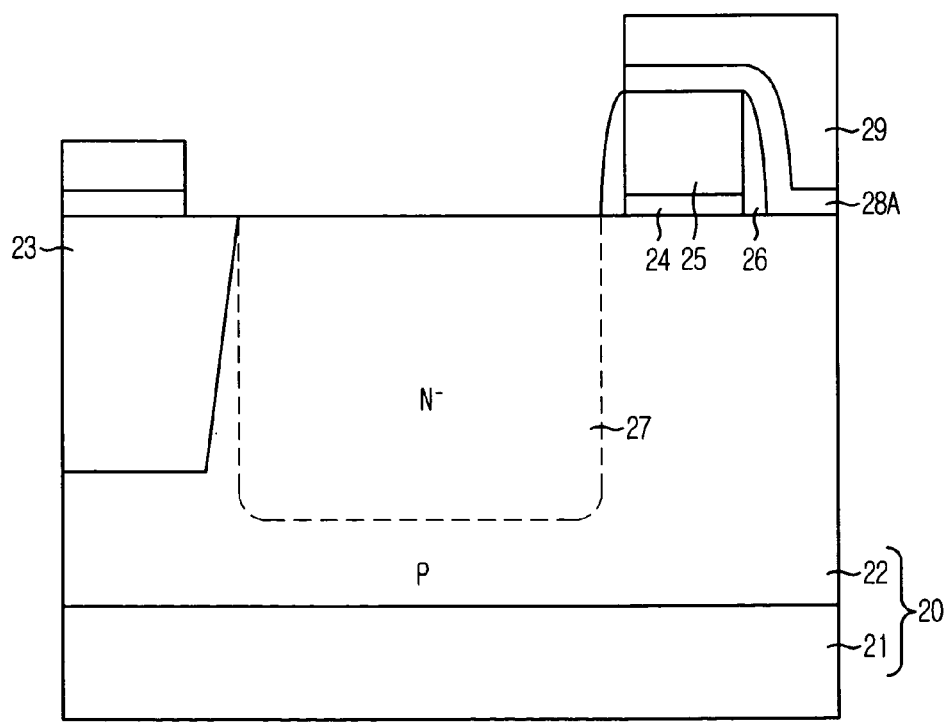

Referring to FIG. 2C, a photoresist layer is formed over the barrier layer 28. The photoresist layer is patterned by a photo-exposure and developing process to form a mask pattern 29 exposing an upper portion of the photodiode region. A wet etching process using buffered oxide etchant (BOE) is performed onto the barrier layer 28 using the mask pattern 29 as a etch barrier to form a patterned barrier layer 28A. Consequently, the patterned barrier layer 28A remains over the regions other than the photodiode region.

Figure 2D:
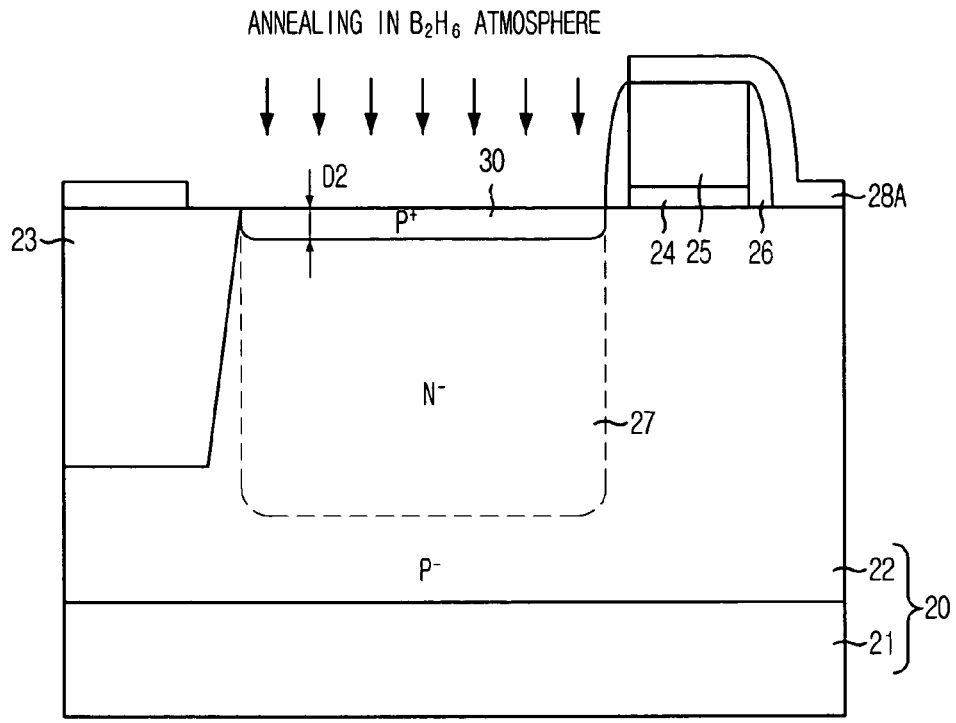

As shown in FIG. 2D, the mask pattern 29 is removed. A P-type impurity region 30 highly doped with boron is formed by flowing a gas including P-type impurity atoms and performing an annealing process in a diborane ($B_2H_6$) gas atmosphere to diffuse boron into the exposed surface of the P-type epitaxial layer 22 of the N-type impurity region 27. The P-type impurity region 30 has a depth of D2. When performing the annealing process in the $B_2H_6$ gas atmosphere, the regions other than the photodiode region, covered by the patterned barrier layer 28A, are not exposed to the $B_2H_6$ atmosphere. Thus, boron is not doped in these regions, and an upper portion of the N-type impurity region 27 is highly doped with boron.

The annealing process in the $B_2H_6$ gas atmosphere is performed at a temperature ranging from approximately 500° C. to approximately 1,000° C. using a furnace process. Particularly, a rapid thermal process can be used to reduce a thermal budget. Hydrogen ($H_2$) or nitrogen ($N_2$) is added to the annealing process to dilute the $B_2H_6$ gas. Instead of the $B_2H_6$ gas, other boron source gas can be used as an annealing atmosphere gas. For example, borane ($BH_3$) can be used as the boron source gas.

In this specific embodiment of the present invention, the P-type impurity region 30 is formed above the N-type impurity region 27 by employing the annealing process instead of an ion implantation process. The P-type impurity region 30 is employed to isolate the photodiode and the top surface of the P-type epitaxial layer 22 to reduce an inflow of dark current. The dark current is caused by a silicon dangling bond on the surface of the P-type epitaxial layer 22. Thus, the P-type impurity region 30 is highly doped with boron to form a $P^+$-type impurity region instead of a $P^0$-type impurity region.

If the P-type impurity region 30 is formed by employing the annealing process in the $B_2H_6$ gas atmosphere, ion collisions at the surface of the P-type epitaxial layer 22 do not occur, and thus, a crystallization defect can be reduced. The P-type impurity region 30 is formed by diffusing boron disintegrated from the $B_2H_6$ gas. Because the annealing process is used instead of the ion implantation process, boron can be doped thinly with a sufficiently high concentration by controlling a flow of the $B_2H_6$ gas. By forming the highly doped P-type impurity region 30 with the small thickness as represented with reference denotation D2, the light characteristics can be improved with respect to a range of wavelength for the blue light and green light.

Figure 2E:
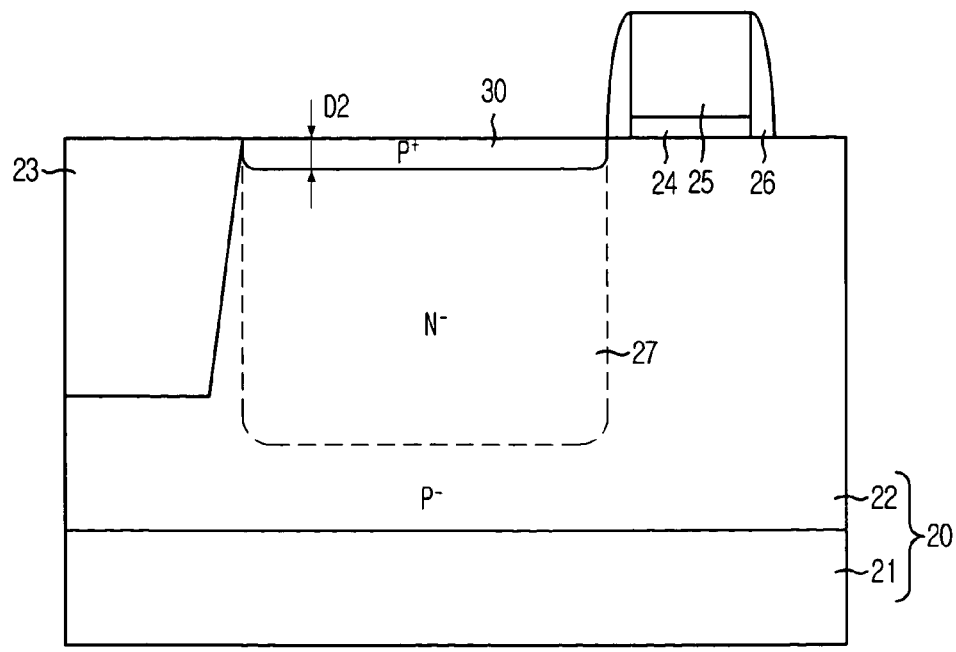

As shown in FIG. 2E, the patterned barrier layer 28A is removed by performing a wet etching process using hydrogen fluoride (HF) solution. If the patterned barrier layer 28A is removed by a dry etching process, a crystallization defect may occur due to ion collisions generated during the dry etching process. Thus, a wet etching process is specifically performed to remove the patterned barrier layer 28A.

In accordance with the specific embodiment of the present invention, by forming the P-type impurity region above the photodiode by employing the annealing process in the $B_2H_6$ gas atmosphere including the P-type impurity atoms, the crystallization defect caused by the ion implantation process can be reduced. Because the P-type impurity region is highly doped and thinly formed by employing the annealing process, the dark current is decreased and the light characteristics can be improved with respect to a range of wavelength for the blue light and green light.

The present application contains subject matter related to the Korean patent application No. KR 2005-58458, filed in the Korean Patent Office on Jun. 30, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A method for fabricating a complementary metal-oxide semiconductor (CMOS) image sensor, comprising:
   performing an ion implantation process onto a photodiode region in a first conductivity type semiconductor layer to form a second conductivity type first impurity region; and
   performing an annealing process in a gas atmosphere including first conductivity type impurity atoms to form a first conductivity type second impurity region underneath a surface of the first conductivity type semiconductor layer in the second conductivity type first impurity region, wherein the first conductivity type second impurity region is doped with the diffused first conductivity impurity atoms,
   wherein the performing of the annealing process in the gas atmosphere including the first conductivity type impurity atoms to form the first conductivity type second impurity region comprises:
   forming a barrier layer over the substrate structure obtained before the annealing process;
   selectively wet etching the barrier layer to expose the surface of the first conductivity type semiconductor layer above the second conductivity type first impurity region; and
   performing the annealing process in the gas atmosphere including the first conductivity type impurity atoms onto the surface of the first conductivity type semiconductor layer exposed by the barrier layer to form the first conductivity type second impurity region.

2. The method of claim 1, wherein the performing of the annealing process in the gas atmosphere including the first conductivity type impurity atoms to form the first conductivity type second impurity region further comprises:
   removing the barrier layer after the performing the annealing process.

3. The method of claim 1, wherein the performing of the annealing process in the gas atmosphere including the first conductivity type impurity atoms comprises performing a furnace process.

4. The method of claim 1, wherein the performing of the annealing process in the gas atmosphere including the first conductivity type impurity atoms comprises performing a rapid thermal process.

5. The method of claim 1, wherein the performing of the annealing process in the gas atmosphere including the first conductivity type impurity atoms comprises performing at a temperature ranging from approximately 5000 C. to approximately 1,0000 C.

6. The method of claim 1, wherein the performing of the annealing process in the gas atmosphere including the first conductivity type impurity atoms comprises performing the annealing process in a gas atmosphere including boron atoms.

7. The method of claim 6, wherein the gas atmosphere including boron atoms includes diborane ($B_2H_6$) gas.

8. The method of claim 7, wherein one of hydrogen ($H_2$) gas and nitrogen ($N_2$) gas is added to dilute the $B_2H_6$ gas.

9. The method of claim 2, wherein the barrier layer includes an oxide-based layer.

10. The method of claim 9, wherein the oxide-based layer is deposited by employing a low pressure furnace chemical vapor deposition method.

11. The method of claim 9, wherein the oxide-based layer is deposited by employing a single-wafer type chemical vapor deposition method.

12. The method of claim 9, wherein the oxide-based layer includes tetraethyl orthosilicate (TEOS).

13. The method of claim 2, wherein the removing of the barrier layer eemjpfises is performed by using hydrogen fluoride (HF) solution.

14. The method of claim 1, wherein the first conductivity type is a P-type; and the second conductivity type is an N-type.

15. The method of claim 1, wherein the selectively wet etching the barrier layer is performed by using buffered oxide etchant (BOE).

* * * * *